United States Patent [19]
Kwok et al.

[11] Patent Number: 5,770,499
[45] Date of Patent: Jun. 23, 1998

[54] PLANARIZED CAPACITOR ARRAY STRUCTURE FOR HIGH DENSITY MEMORY APPLICATIONS

[75] Inventors: Siang Ping Kwok, Dallas; Peter S. McAnally, McKinney; Darius L. Crenshaw, Plano, all of Tex.

[73] Assignee: Texas Instruments Incorporated, Dallas, Tex.

[21] Appl. No.: 865,577

[22] Filed: May 29, 1997

[51] Int. Cl.[6] .............................................. H01L 21/8242
[52] U.S. Cl. ......................... 438/253; 438/254; 438/396
[58] Field of Search ................................... 438/238–241, 438/253–256, 396–397

[56] References Cited

U.S. PATENT DOCUMENTS

| | | | |
|---|---|---|---|
| 5,389,568 | 2/1995 | Yun | 438/253 |
| 5,597,760 | 1/1997 | Hirota | 438/256 |
| 5,604,146 | 2/1997 | Tseng | 438/253 |

*Primary Examiner*—Jey Tsai
*Attorney, Agent, or Firm*—Jacqueline J. Garner; W. James Brady, III; Richard L. Donaldson

[57] ABSTRACT

A planarized capacitor array (182) and method of forming the same for high density applications. A storage node contact (116) is formed through an interlevel dielectric (110) on a semiconductor body (102). Then, an oxide layer (170) having a first thickness is deposited over the interlevel dielectric (110) and the storage node contact (116). A nitride layer (172) having a second thickness is deposited over the oxide layer (170) to protect the oxide layer (170) during later processing. The nitride layer (172) and oxide layer (170) are then patterned and etched to form a storage plate cavity (180). The capacitor array (182) is then formed in the storage plate cavity (180). The capacitor array (182) has a height approximately equal to the sum of said first and second thicknesses, so that the surface of the top node of the capacitor array (182) is co-planar with the upper surface of the surrounding oxide/nitride stack (170/172). Thus, the step height normally present between the capacitor array (182) and the peripheral area is avoided.

19 Claims, 8 Drawing Sheets

5,770,499

PLANARIZED CAPACITOR ARRAY STRUCTURE FOR HIGH DENSITY MEMORY APPLICATIONS

CROSS-REFERENCE TO RELATED APPLICATIONS

The following co-assigned patent application is hereby incorporated herein by reference:

| Ser. No. | Filing Date | Inventor |
| --- | --- | --- |
| 08/670,079 | 6/26/96 | Liu et al |

FIELD OF THE INVENTION

This invention generally relates to capacitor structures for high density devices.

BACKGROUND OF THE INVENTION

One common high density memory is the Dynamic random access memory (DRAM). DRAMs comprise an array of individual cells for storing information. These cells are dynamic in that they will only hold a bit of information for a short period of time. Therefore, the cells must be read and refreshed at periodic intervals. The most common cell configuration consists of one transistor 12 and one capacitor 14 as shown in FIG. 1. The transistor 12 is a pass transistor and is connected between a bitline 16 and the capacitor 14. The pass transistor 12 is gated by a wordline signal 18. A bit of information is stored on the capacitor 14 and is read from the cell to the associated bitline or written to the cell from the bitline through pass transistor 12.

As the density of the memory devices increases, it becomes more difficult to achieve sufficient cell capacitance in the smaller area allotted for each cell. One prior art method deposits alternating layers of in-situ doped polysilicon 22 and undoped polysilicon 24. The doped and undoped polysilicon (22,24) have different etch rates. Thus, they may be etched to form a bellows shaped storage node 26 of a capacitor as shown in FIG. 2. This structure has increased surface area and thus increased capacitance for a given cell area of a device. However, it suffers low throughput due to the deposition of doped and undoped polysilicon layers using different deposition tools. Therefore, there is a need for a process having more margin, higher throughput, and/or that is a simplification over the prior art.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a capacitor-over-bitline type DRAM cell. Those of ordinary skill in the art of high density devices such as DRAMs will recognize that the capacitor of the invention may also be used in conjunction with other types of DRAM cells as well as other high density applications.

Figure 1:
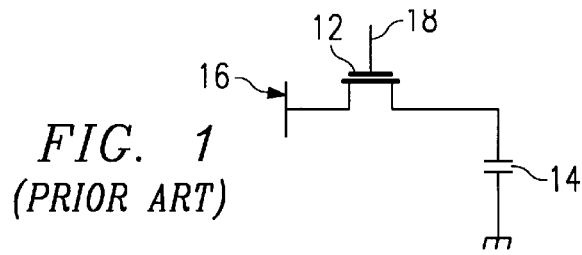
FIG. 1 is a schematic diagram of a prior art DRAM cell.
Figure 2:
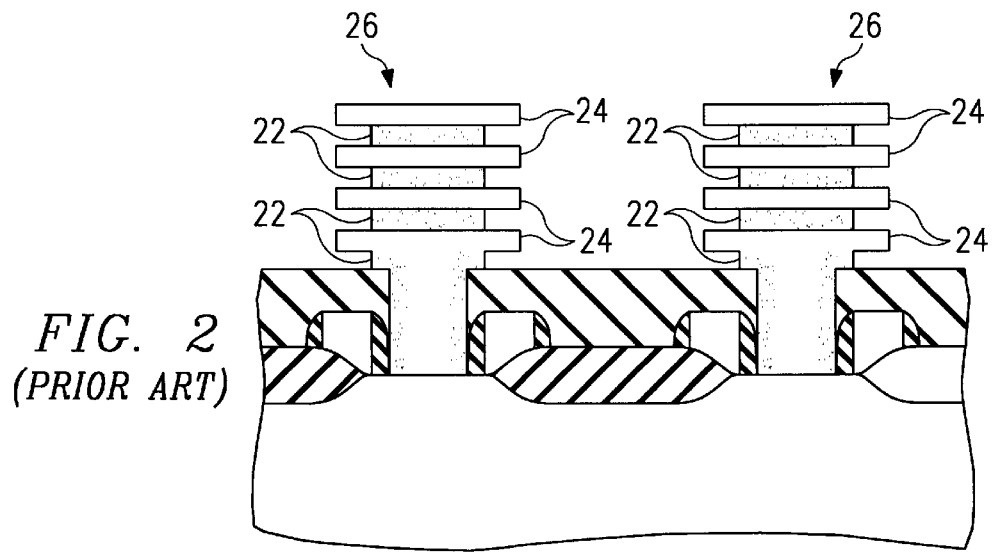
FIG. 2 is a cross-sectional view of a prior art DRAM capacitor.
Figure 3:
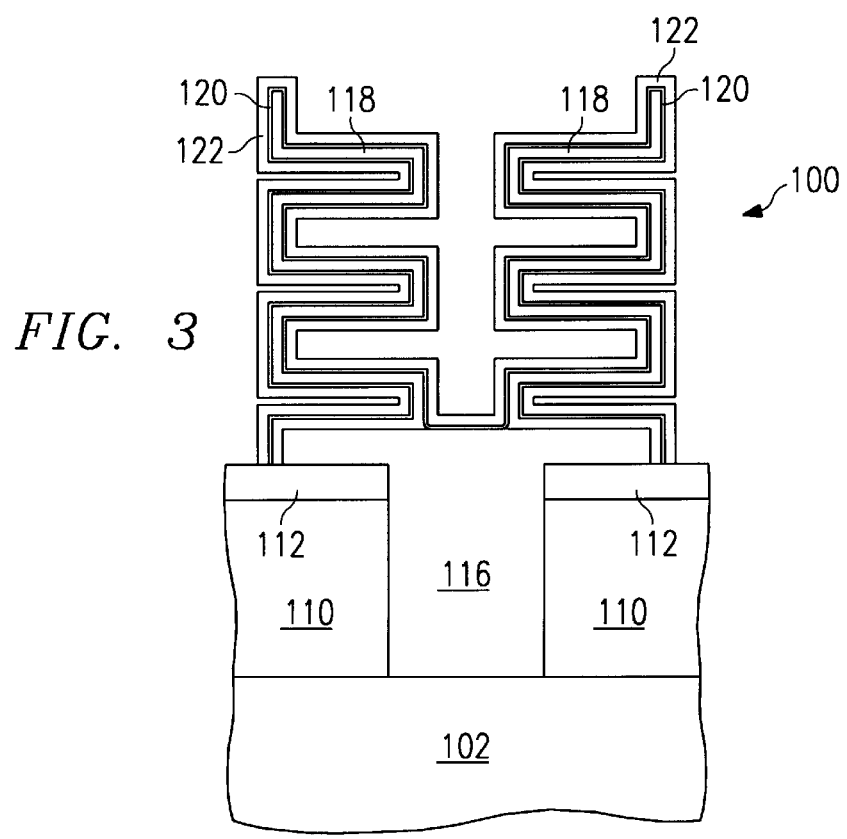
FIG. 3 is a cross-sectional view of a capacitor according to a first embodiment of the invention.

A capacitor 100 according to a first embodiment of the invention is shown in FIG. 3. Capacitor 100 contacts substrate 102 through an interlevel dielectric layer comprising, for example, an oxide layer 110 and a nitride layer 112. The bottom node of capacitor 100 comprises a polysilicon layer 116 and a corrugated-cylinder-shaped polysilicon structure 118 both preferably comprising doped polysilicon. However, other conductive materials may alternatively be used. A capacitor dielectric separates 120 the bottom node (116,118) of capacitor 100 from the top node 122. The capacitor dielectric 120 may, for example, comprise a nitride-oxide bilayer and the top node 122 preferably comprises doped polysilicon. The shape of the polysilicon structure 118 provides a significant increase in surface area of the bottom node (116, 118) and a corresponding increase in capacitance. For example, an increase in surface area on the order of 3.5X can be obtained.

Figure 4:
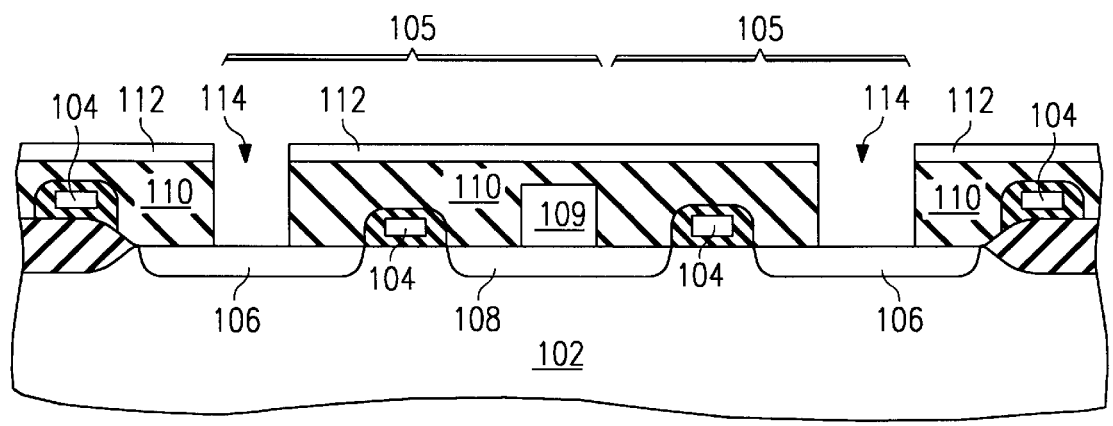
FIG. 4 is a cross-sectional view of a pair of DRAM cells prior to the formation of a storage node.

FIG. 4 illustrates a pair of DRAM cells prior to the formation of a storage capacitor. Wordlines 104 form the gates of transistors 105.Source/drain regions 106 and 108 are formed on opposites sides of wordlines 104. Bitline/bitline contact 109 contact source/drain region 108. Subsequently formed storage capacitors will connect to source/drain regions 106 through interlevel dielectric 110/112. One method form forming such a pair of DRAM cells in described in co-pending U.S. application No. 08/670,079, U.S. Pat. No. 5,671,175 filed Jun. 26, 1997, assigned to Texas Instruments, Inc. and hereby incorporated by reference. Those skilled in the art will realize that the capacitor according to the invention may be used in conjunction with many other known methods for forming DRAM cells.

Figure 5:
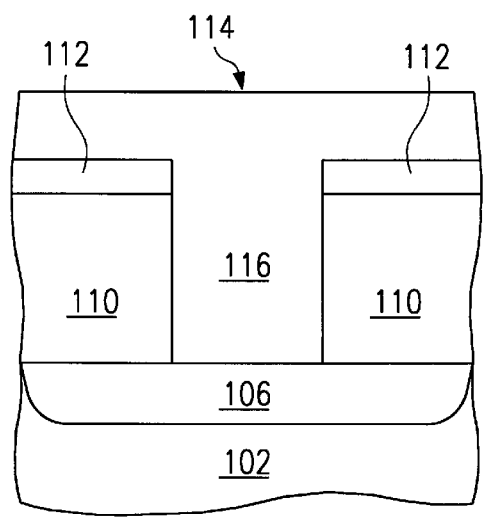
FIGS. 5–8, 9A–9B, 10A–10B, 11A–11B, 12A–12B are cross-sectional views of the capacitor according to the first embodiment of the invention at various stages of fabrication.

A method of forming the capacitor 100 according to the invention into the structure of FIG. 4 will now be described. First, a layer of polysilicon 116 is deposited over nitride layer 112 and in storage node contact area 114, as shown in FIG. 5. If the formation of a nitride layer 112 is not already part of the process, it should be added prior to the etch forming storage node contact area 114. Polysilicon 116 may directly contact source/drain region 106 or a plug (not shown) may be used in storage node contact area 114 to connect polysilicon 116 to source/drain region 106. Polysilicon layer 116 is preferably in-situ doped and deposited to a thickness on the order of 1500 Angstroms ( or approximately one half of the diameter of the storage node contact area 114.

Figure 6:
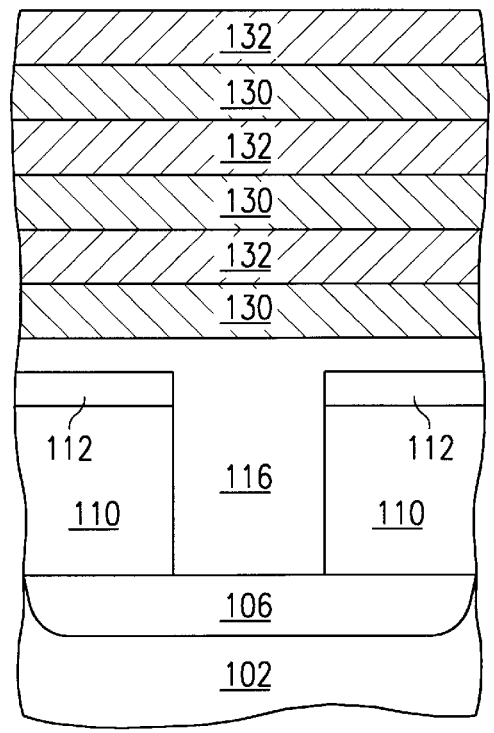

Next, alternating layers (130 and 132) of a first (130) and a second (132) material are deposited, as shown in FIG. 6. The first and second materials have vastly different selectivities in an etch process. For example, the second material layers 132 could comprise TEOS (tetraethoxysilane) and the first material layers 130 could comprise an SACVD (sub-atmospheric chemical-vapor deposition) oxide or PSG (phosphosilicate glass). Various combinations of first and second materials will be apparent to those skilled in the art. For example, combinations of doped and undoped oxides or hard and soft oxides could be used. However, it should be noted that the first and second materials should also be capable of being etched selectively with respect to polysilicon. An etch selectivity ratio on the order of 20:1 or greater is desirable. However, selectivities as low as 5:1 may also be used.

The thickness of alternating layers 130 and 132 may be on the order of 150–500 Å. Although shown as the same thickness, it should be noted that layers 130 and 132 need not be of the same thickness. The thickness is a design variable chosen on the basis of, for example, desired surface area and the area required for the subsequent steps of forming the capacitor dielectric and top node of the capacitor. The number of alternating layers 130,132 may also vary depending of the surface area desired and mechanical stability/reliability of the resulting structure. At least two of each layer 130, 132 should be used.

Figure 7:
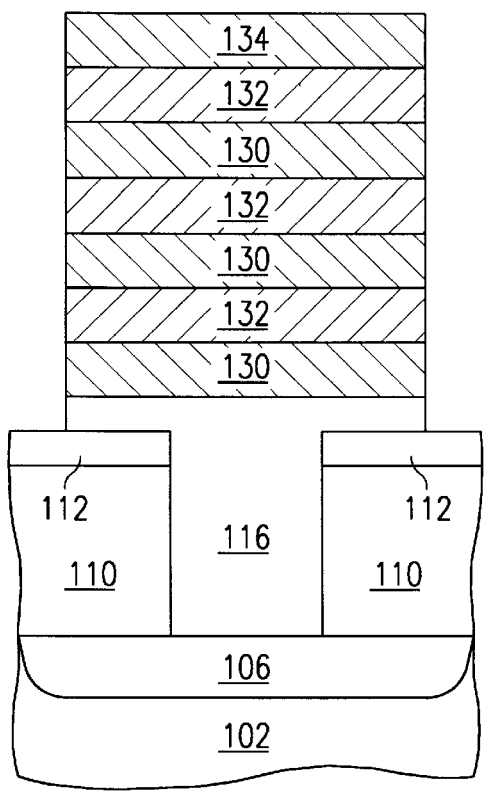

As shown in FIG. 7, the structure is patterned, for example using a layer of resist 134, and anisotropically etched. The etch of polysilicon layer 116 is optional at this point and may be delayed until later in the process to limit the number of polysilicon etches. Resist layer 134 is then removed.

Figure 8:
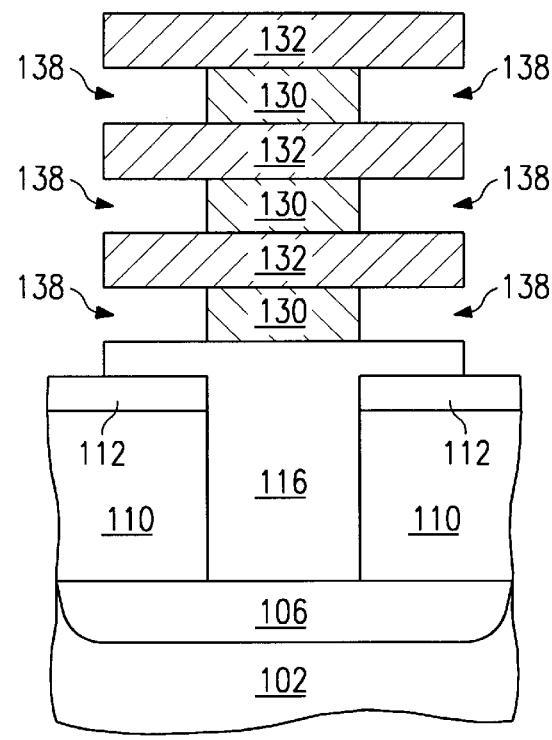

The layers of first material 130 are then selectively etched with respect to the layers of second material 132, as shown in FIG. 8. The first material layers 130 are etched radially to undercut the first material layers 130 from the second material layers 132. The etch chemistry and type may vary depending on the composition of the first and second materials. For example, if 11% PSG and TEOS are used, respectively, a 1% unbuffered HF etch may be used for a duration on the order of 35–40 sec. The duration of the etch is determined by the extent of the undercut desired. Other appropriate etches, such as an appropriate vapor HF etch or an isotropic plasma etch, will be apparent to those of ordinary skill in the art having reference to the specification. If polysilicon layer 116 has been previously etched, nitride layer 112 prevents oxide layer 110 from being affected during this etch. However, even if this nitride layer were absent, a negligible amount of the appropriate interlevel dielectric comprising the top surface of material 110 should be consumed in such a dilute HF etch.

Using a process that allows for the minimum growth of native oxide on polysilicon, a thin conformal layer of polysilicon 136 is deposited on the structure including the undercut areas 138. For example, an insitu vapor HF unit on a polysilicon deposition cluster tool may be used. Alternatively, a 400 C push insitu doped polysilicon deposition immediately after the selective first material etch may be used. Other etches will be apparent to those of ordinary skill in the art having reference to the specification. It should be noted that although polysilicon is conventionally used to form the capacitor, other conductive materials may be used in place of polysilicon.

Figure 9A:
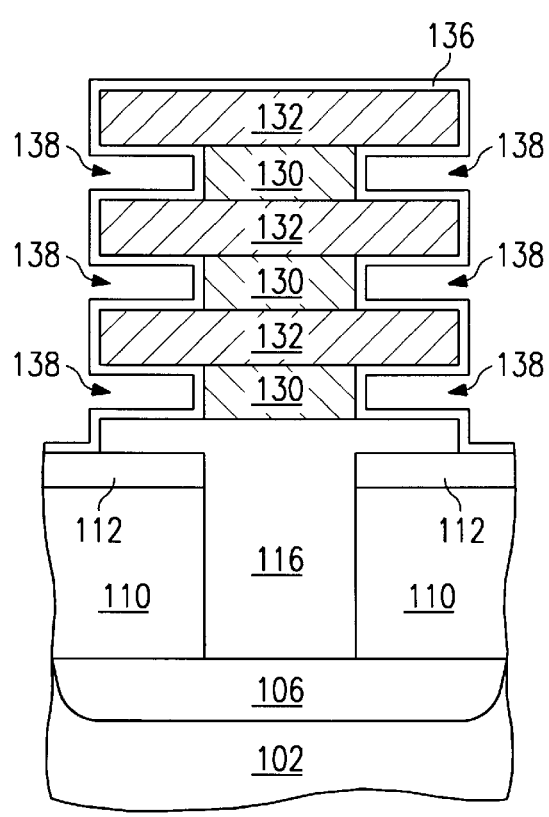
Figure 9B:
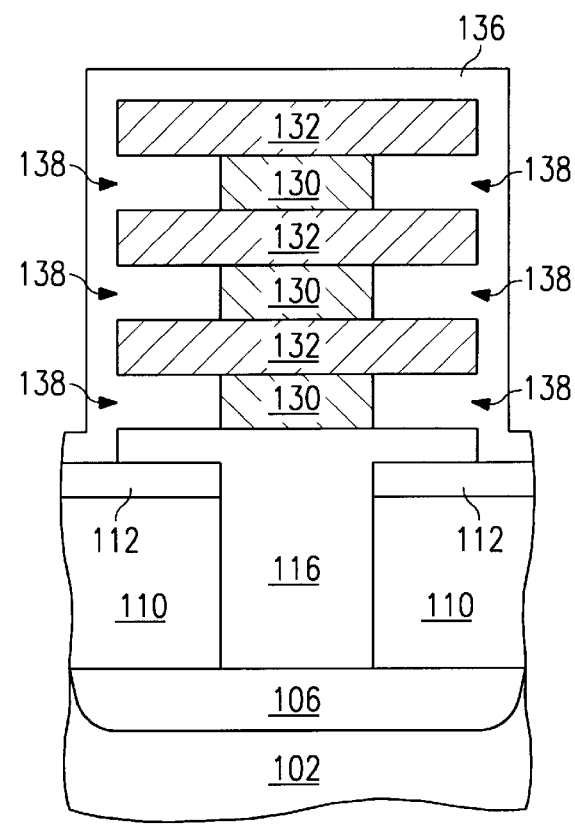

The polysilicon layer 136 is deposited to a thickness on the order of 700 angstroms and is preferably doped. The thickness of polysilicon layer 136 depends on the thicknesses of the first and second material layers (130,132). The thickness of the first material layers 130 is the most critical. If the thickness of polysilicon layer 136 is less than one-half of the thickness of the first material layers 130, then the structure shown in FIG. 9a is obtained. If the thickness of polysilicon layer 136 is greater than one half the thickness of first material layers 130, the structure of FIG. 9b is obtained. In the preferred embodiment, the polysilicon layer 136 should have a thickness of on the order of 200 Å and no more than 2000 Å. It should be noted that for the structure of FIG. 9a, the polysilicon layer 136 thickness should be less than half the thickness of the first material layers by an amount sufficient to allow a capacitor dielectric and top capacitor node to be formed within the undercut areas 138.

Figure 10A:
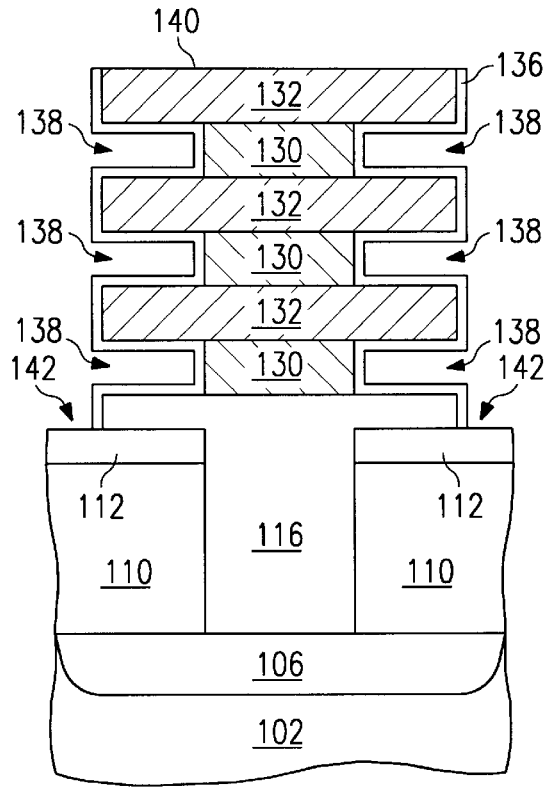
Figure 10B:
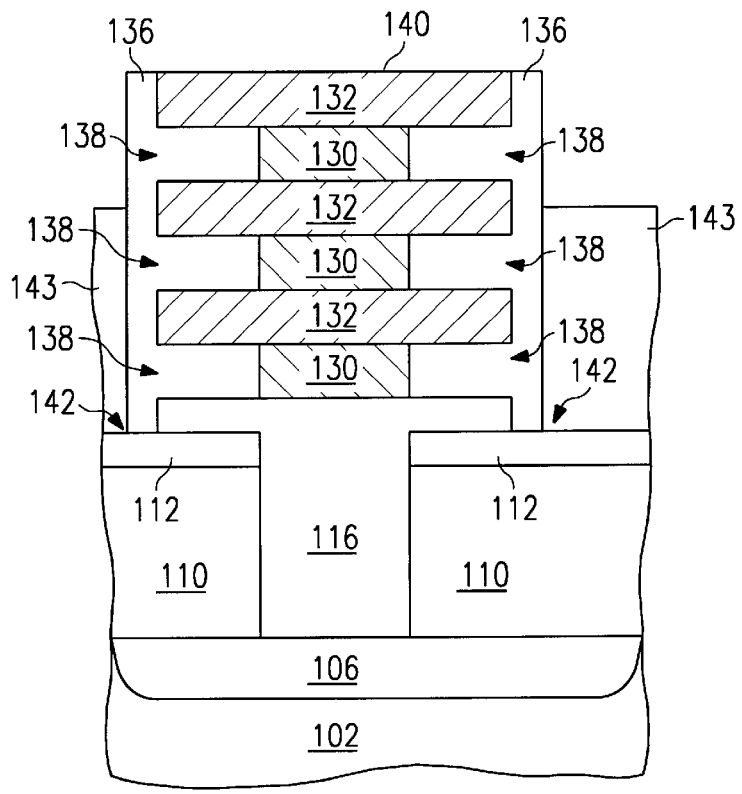

As shown in FIGS. 10a–b, a polysilicon etch-back is performed next. This removes polysilicon from the top surface 140 of the storage node and from the area between storage nodes 142. The portions of polysilicon layer 136 on the sides of the structure and in the undercut areas 138 remain after the etch-back. It should be noted that if polysilicon layer 136 was deposited undoped, it may be doped prior to the etchback. Prior to the polysilicon etchback, an optional thin layer of rugged polysilicon may be deposited over polysilicon layers 116 and 136. This allows for further surface area enhancement. Methods for depositing rugged polysilicon to further enhance the surface area are well known in the art.

Figure 11A:
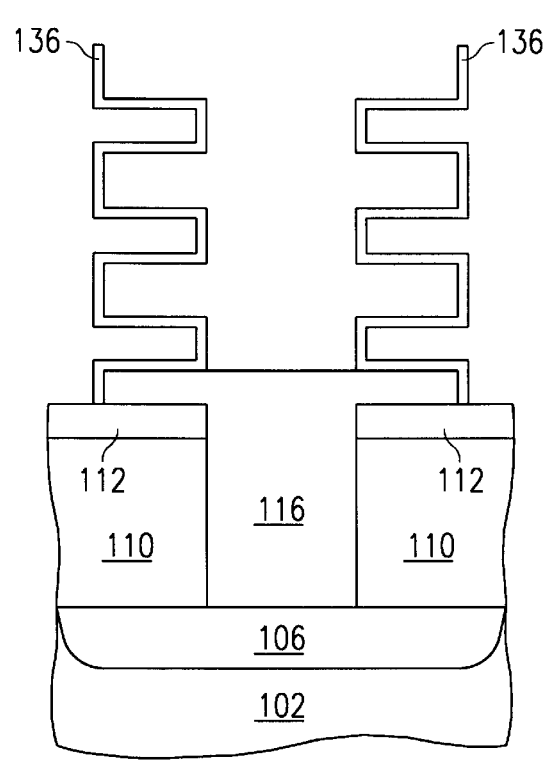
Figure 11B:
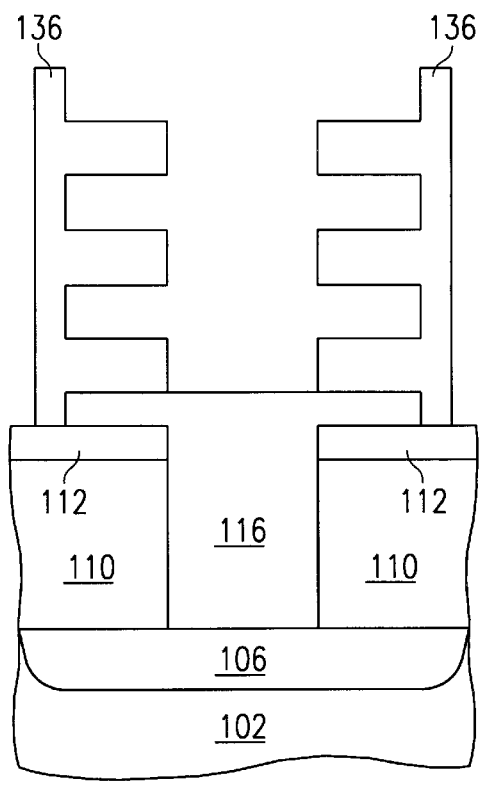

Next, the layers of first and second material (130,132) are removed. If desired, a resist layer 143 can be spin deposited and etched back prior to the removal of the first and second materials (130,132) in order to protect the oxide regions between the storage nodes. Preferably, an isotropic (wet or plasma) etch is used to remove the layers of first and second material (130,132) to ensure the complete removal of these layers. The etch is selective against etching polysilicon. Polysilicon layer 136 remains intact as shown in FIGS. 11a–b.

Figure 12A:
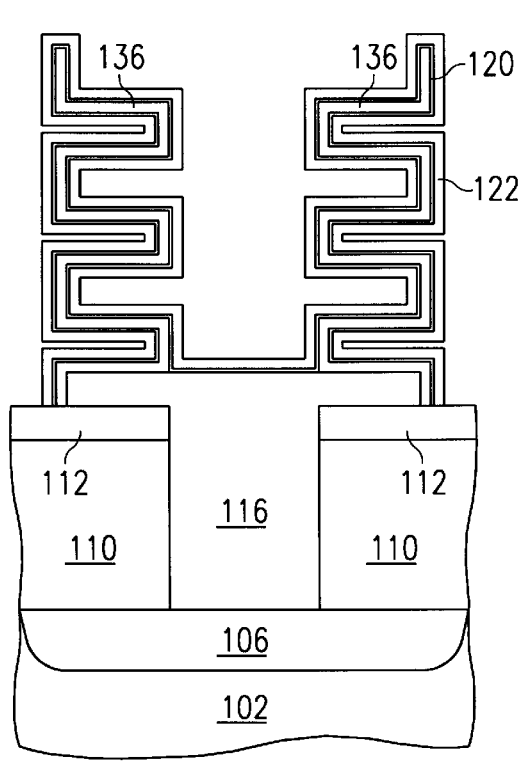
Figure 12B:
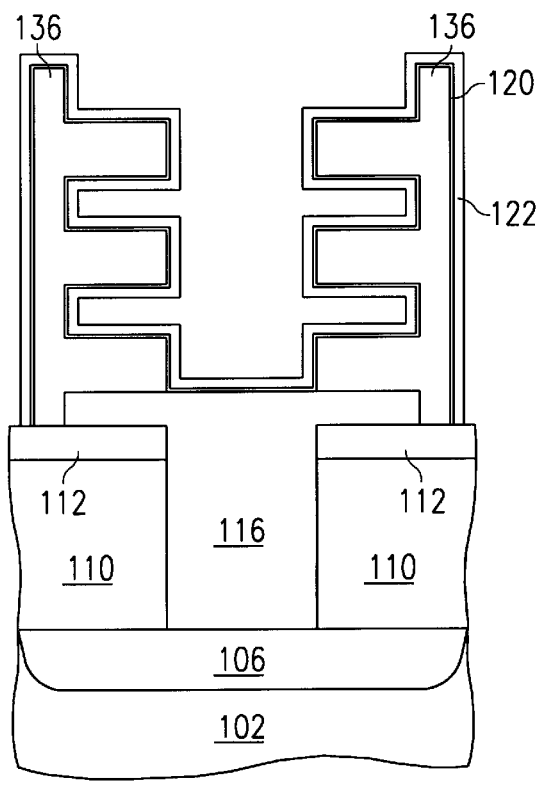

The structure is completed by forming the capacitor dielectric 120, for example and a nitride/oxide bilayer, and a top node 122 of the storage capacitor 100. The top node 122 of the storage capacitor 100 preferably comprises doped polysilicon. The completed structure is shown in FIGS. 12a–b. The structure of FIG. 12a yields more surface area, whereas the structure of FIG. 12b is more robust and manufacturable.

Figure 13:
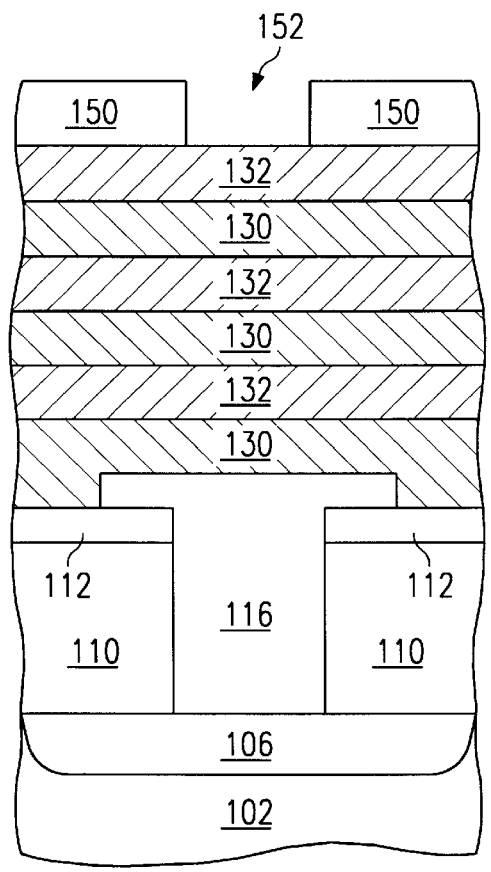
FIGS. 13–15, 16A–16B, 17A–17B are cross-sectional views of a capacitor according to a second embodiment of the invention at various stages of fabrication.
Figure 14:
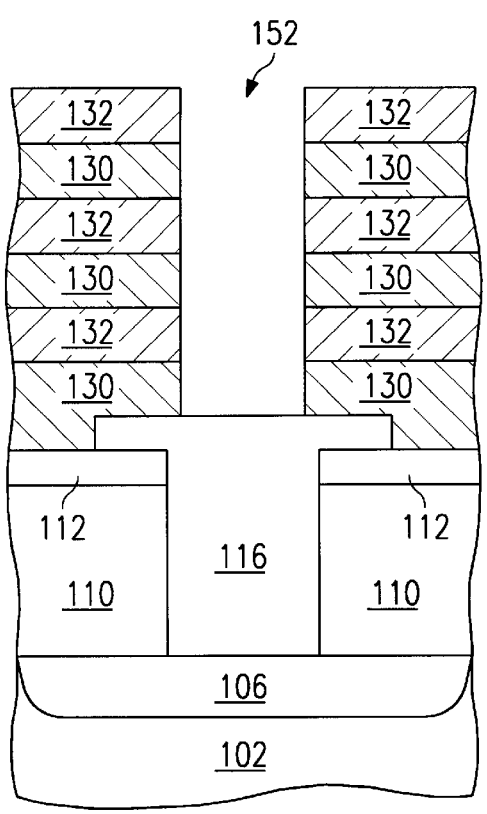

A method of forming a second embodiment of the invention will now be described. The second embodiment is a mirror image of the first embodiment and may be preferred due to higher mechanical stability. The polysilicon layer 116 and alternating layers of first and second material 130,132 are deposited as in the first embodiment. However, the polysilicon pad layer 116 may be patterned and etched at this point with a store pattern. This eliminates the need to etch this layer later on in the process. These layers are then patterned using masking layer 150 as shown in FIG. 13. An area 152 in the center of where the storage node will be is exposed. This area may be on the order of one quarter to one third the width of the final structure. A hard mask with a sidewall spacer may be required in order to obtain a hole smaller in diameter than the minimum critical dimension (CD). For example, for a minimum capacitor width of 2600 Å, area 152 may be on the order of 1000 Å. An anisotropic etch is then performed to remove layers 130 and 132 below area 152 as shown in FIG. 14.

Figure 15:
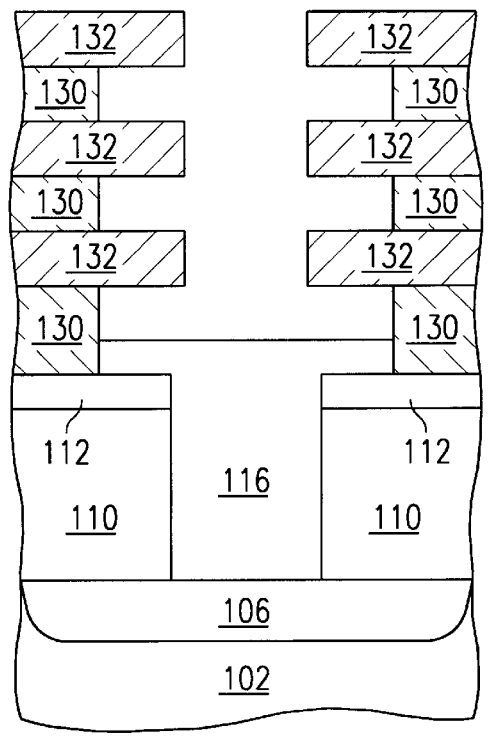

Next, a selective etch is performed to etch the first material layers 130 selectively with respect to the second material layers 132. The first material layers 130 are etched radially to undercut the first material layers 130 from the second material layers 132, as shown in FIG. 15. As with the first embodiment, the etch chemistry and type may vary depending on the composition of the first and second materials. For example, if PSG and TEOS are used, respectively, a 1% unbuffered HF may be used for a duration on the order of 35–40 sec.. The duration of the etch is determined by the extent of the undercut desired. Other appropriate etches, such as an appropriate vapor HF etch or an isotropic plasma etch, will be apparent to those of ordinary skill in the art having reference to the specification.

Figure 16A:
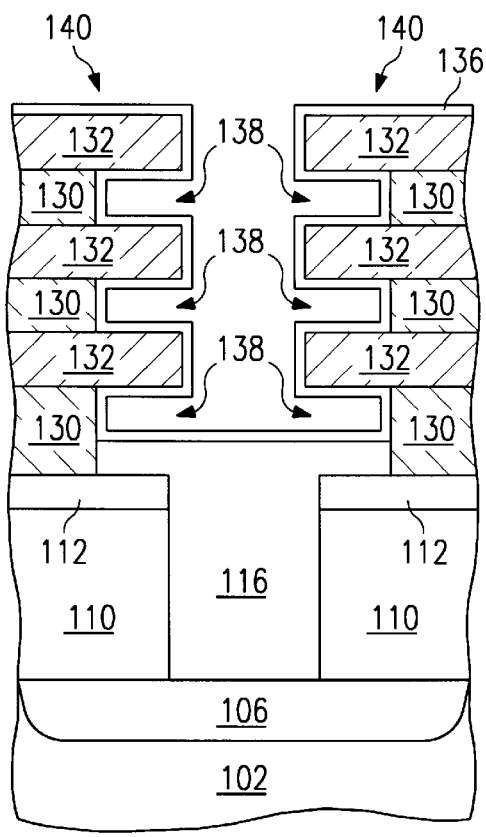
Figure 16B:
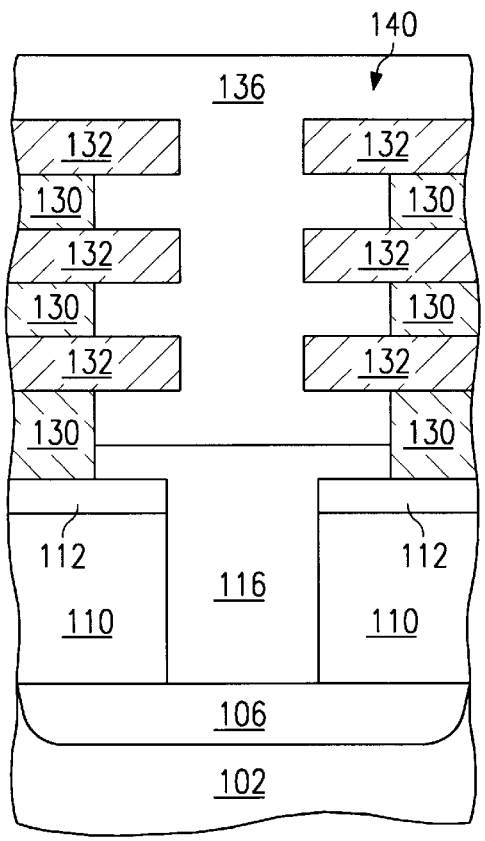

Using a process that allows for the minimum growth of native oxide on polysilicon, a thin conformal layer of polysilicon 136 is deposited on the structure including the undercut areas 138, as in the first embodiment. The polysilicon layer 136 may be deposited to a thickness on the order of 1000 angstroms and is preferably doped. As in the first embodiment, the thickness of polysilicon layer 136 depends on the thicknesses of the first and second material layers (130,132). If the thickness of polysilicon layer 136 is less than one-half of the thickness of the first material layers 130, then the structure shown in FIG. 16a is obtained. If the thickness of polysilicon layer 136 is greater than one half the thickness of first material layers 130, the structure of FIG. 16b is obtained.

An optional thin layer of rugged polysilicon may be deposited over polysilicon layers 116 and 136. This allows for further surface area enhancement. Methods for depositing rugged polysilicon to further enhance the surface area are well known in the art. A polysilicon etch-back is performed next. This removes polysilicon from the top surface 140 of the storage node. The portions of polysilicon layer 136 on the sides of the structure and in the undercut areas 138 remain after the etch-back. It should be noted that if polysilicon layer 136 was deposited undoped, it may be doped prior to the etchback.

Figure 17A:
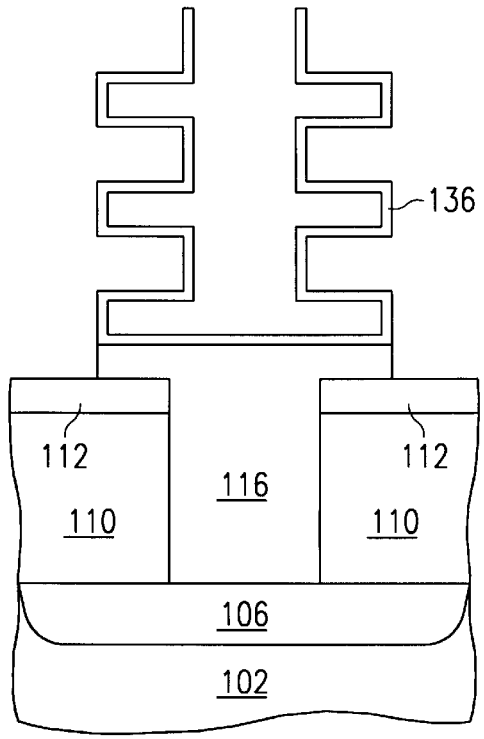
Figure 17B:
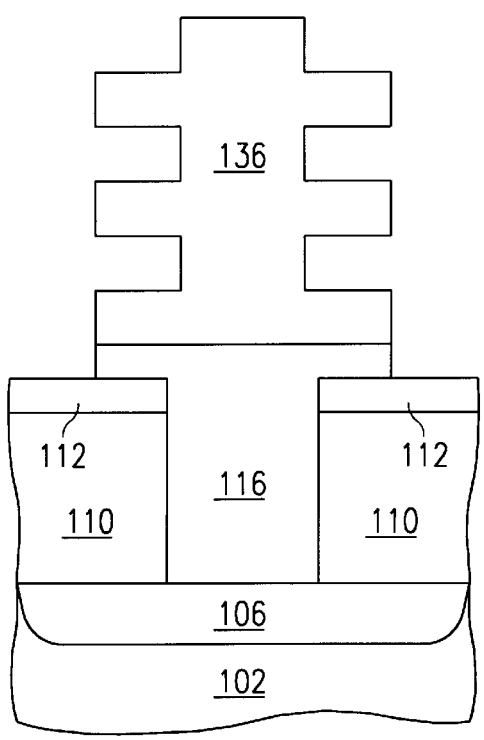

Next, the layers of first and second material (130,132) are removed. Preferably, an isotropic (wet or plasma) etch is used to ensure the complete removal of these layers. The etch is selective against etching polysilicon. Polysilicon layer 136 remains intact as shown in FIGS. 17a–b. The portion of polysilicon layer 116 between storage nodes is removed at this point if it has not been removed previously.

The structure is completed by forming a capacitor dielectric and a top node the storage capacitor, similar to that described above with respect to the first embodiment. The top node of the storage capacitor preferably comprises doped polysilicon. The capacitor dielectric may, for example, comprise a nitride/oxide bilayer. The structure of FIG. 17a yields more surface area, whereas the structure of FIG. 17b is more robust and manufacturable.

Figure 18:
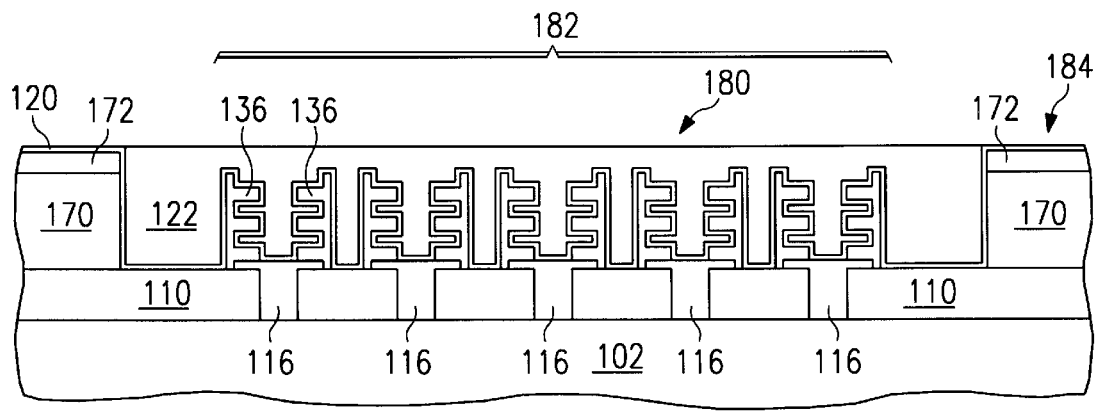
FIG. 18 is a cross-sectional view of a planarized capacitor array according to a third embodiment of the invention.

A planarized capacitor array 182 according to a third embodiment of the invention is shown in FIG. 18. The capacitor structures of capacitor array 182 are illustrated similar to that of the first embodiment. However, the planarized structure and method of the third embodiment may also be applied to other capacitor over bitline structures known in the art. Capacitor array 182 is located within a storage plate cavity 180. Storage plate cavity 180 is bounded by a planarizing structure that includes a dielectric portion 170 and a dielectric mask portion 172. Dielectric portion 170 may, for example, be an oxide such as BPSG and the dielectric mask portion 172 may, for example, comprise silicon nitride. The height of dielectric portions 170 and 172 combined is approximately equal to the height of the final capacitor structures of capacitor array 182. Planarizing structure (170,172) avoids the traditional step height difference between the area of the device containing the capacitor array and the peripheral region. The step height difference increases as density of the array increases. For example, in a 256 Meg DRAM, the step height difference may be on the order of 500 nm. The step height difference creates significant problems in forming the subsequent interconnect levels because these interconnect levels must transition between the peripheral area and the capacitor array area. Including planarizing structure (170,172) avoids this problem.

Figure 19:
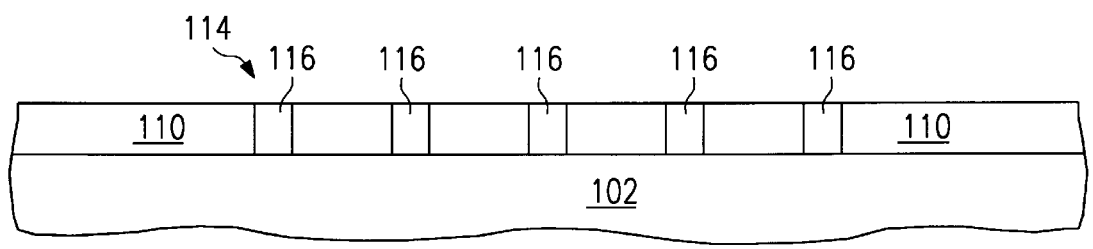
FIGS. 19–20 are cross-sectional view of the planarized capacitor array of FIG. 18 are various stages of fabrication.
Figure 20:
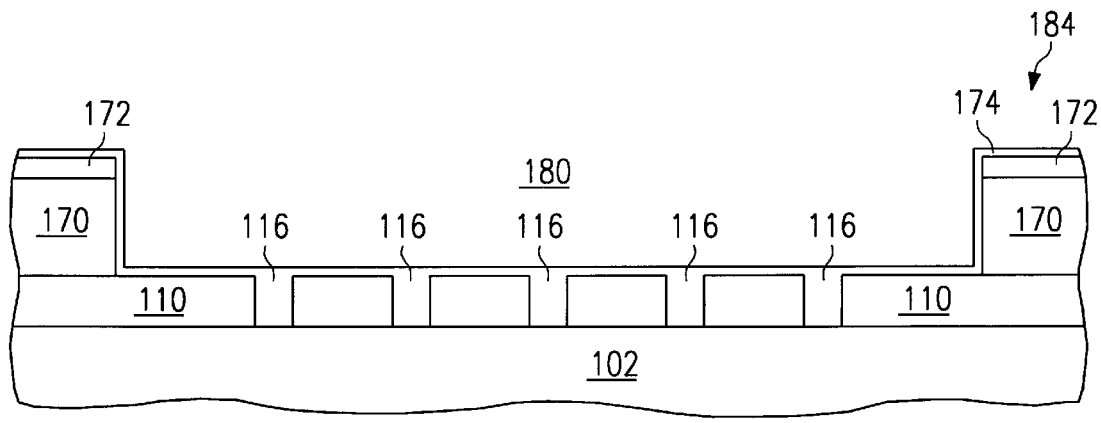

A method of forming the capacitor array according to the third embodiment of the invention into the structure of FIG. 4 will now be discussed. First, a polysilicon plugs 116 are formed within storage node contact area 114 and nitride layer 112 is removed, as shown in FIG. 19. The structure of FIG. 19 is planarized. Next, a layer of dielectric material 170 is deposited over the structure. Dielectric material 170 preferably comprises an oxide such as BPSG. A layer of nitride 172 is then deposited over the oxide layer 170. The thicknesses of oxide layer 170 and nitride layer 172 are chosen such that the combined height of the two layers is approximately equal the desired height of the final capacitor structure. For example, this may be on the order of 500 nm. Nitride layer 172 and oxide layer 170 are then patterned and etched to form storage plate cavity 180 bounded by a planarizing structure 184, as shown in FIG. 20. Planarizing structure 184 consists of the remaining portions of oxide layer 170 and nitride layer 172. Nitride layer 172 serves as a masking layer in subsequent processing steps to protect oxide layer 170.

A layer of polysilicon 174, preferably in situ doped, is then deposited over nitride layer 172 and in storage plate cavity 180. Polysilicon layer 174 may be on the order of 40 nm. Polysilicon layer 174 protects the vertical edges of oxide layer 170 and the surface of interlevel dielectric layer 110 during subsequent processing steps. Processing then continues to form the capacitor array 182. Capacitor array 182 may be formed as described above with respect to the first or second embodiments beginning with the deposition of the alternating oxide layers 130 and 132. Alternatively, other capacitor structures known in the art may also be used. After depositing the top electrode material 122, the top electrode material, typically polysilicon, is then etched back or otherwise removed to be co-planar with the height of planarizing structure 184 as shown in FIG. 18. This results in a planarized structure that avoids the step height and associated problems found in the prior art.

While this invention has been described with reference to illustrative embodiments, this description is not intended to be construed in a limiting sense. Various modifications and combinations of the illustrative embodiments, such as choosing the first and second materials such that the second material etches faster than the first material, as well as other embodiments of the invention, will be apparent to persons skilled in the art upon reference to the description. It is therefore intended that the appended claims encompass any such modifications or embodiments.

What is claimed is:

1. A method for forming a planarized capacitor array on a semiconductor body comprising the steps of:

forming a storage node contact through an interlevel dielectric on said semiconductor body;

depositing a dielectric layer having a first thickness over said interlevel dielectric and said storage node contact;

depositing a dielectric masking layer having a second thickness over said dielectric layer;

patterning and etching said dielectric masking layer and said dielectric layer to form a storage plate cavity;

forming a capacitor array in said storage plate cavity, said capacitor array having a height approximately equal to the sum of said first and second thicknesses.

2. The method of claim 1, wherein said dielectric layer comprises an oxide layer.

3. The method of claim 2, wherein said oxide layer is BPSG.

4. The method of claim 1, wherein said dielectric masking layer comprises silicon nitride.

5. The method of claim 1, further comprising the step of forming a layer of polysilicon in said storage plate cavity prior to said step of forming said capacitor array.

6. The method of claim 1, wherein said step of forming said capacitor array comprises the steps of:

forming a plurality of bottom nodes of said capacitor array;

forming a capacitor dielectric over said plurality of bottom nodes; and forming a top node of said capacitor array, said top node filling said storage plate cavity.

7. The method of claim 1, wherein said step of forming said capacitor array comprises the steps of:

depositing a first film having a first etch selectivity in said storage plate cavity;

depositing a second film having a second etch selectivity on said first film;

repeating said steps of depositing said first film and depositing said second film at least one time to form a plurality of first film layers alternated with a plurality of second film layers;

patterning and etching said pluralities of first and second film layers;

selectively etching said plurality of first and second film layers, wherein said first etch selectivity is less than said second etch selectivity, to form a plurality of undercut areas wherein the plurality of first film layers are undercut from said plurality of second film layers;

depositing a conformal layer of conductive material over said pluralities of first and second film layers including in said undercut areas;

etching back said conformal layer of conductive material;

selectively removing said pluralities of first and second film layers without removing said conformal layer of conductive material;

forming a capacitor dielectric over said conformal layer of conductive material; and forming a top node over said capacitor dielectric, said top node filling said storage plate cavity.

8. The method of claim 7, wherein said second film comprises tetraethoxysilane (TEOS).

9. The method of claim 7, wherein said first film comprises phosphosilicate glass.

10. The method of claim 7, wherein said first film comprises SACVD oxide.

11. The method of claim 7, wherein said conformal layer of conductive material is deposited to a thickness greater than one half a thickness of said first film.

12. The method of claim 7 wherein said conformal layer of conductive material is deposited to a thickness less than one half a thickness of said first film.

13. The method of claim 7, further comprising the steps of:

depositing a layer of rugged polysilicon over said conformal layer of conductive material after said step of depositing said conformal layer of conductive material.

14. The method of claim 7, wherein said conductive material is polysilicon.

15. A method of forming a capacitor array for high density applications, comprising the steps of:

forming a storage node contact through an interlevel dielectric on said semiconductor body;

depositing an oxide layer having a first thickness over said interlevel dielectric and said storage node contact;

depositing a nitride layer having a second thickness over said oxide layer;

patterning and etching said nitride layer and said oxide layer to form a storage plate cavity bounded by said nitride and oxide layers;

depositing a first layer of polysilicon in said storage plate cavity, said first layer of polysilicon covering a vertical edge of said oxide layer;

forming a plurality of bottom nodes of said capacitor array in said storage plate cavity;

forming a capacitor dielectric over said plurality of bottom nodes; and forming a top node of said capacitor array, said top node filling said storage plate cavity.

16. The method of claim 15, wherein said step of forming said plurality of bottom nodes comprises the steps of:

depositing a plurality of alternating layers of first and second material on said first polysilicon layer, said first and second materials having different etch selectivities;

patterning said plurality of alternating layers to expose a first area;

anisotropically etching said plurality of alternating layers in said first area to expose said first layer of polysilicon;

selectively and radially etching said plurality of alternating layers to undercut ones of said plurality of alternating layer comprising said first material from ones of said plurality of alternating layers comprising said second material;

depositing a second layer of polysilicon over said plurality of alternating layers;

etching back said second layer of polysilicon to expose a top surface of said plurality of alternating layers; and selectively removing said plurality of alternating layers without removing said second layer of polysilicon.

17. The method of claim 16, wherein said second material comprises tetraethoxysilane (TEOS).

18. The method of claim 16, wherein said first material comprises phosphosilicate glass.

19. The method of claim 16, wherein said first material comprises SACVD oxide.

* * * * *